United States Patent [19]
Zabawski et al.

[11] Patent Number: 5,951,152
[45] Date of Patent: Sep. 14, 1999

[54] LIGHT SOURCE HOUSING APPARATUS AND METHOD OF MANUFACTURE

[75] Inventors: Henrick A. Zabawski, Arlington Heights; Robert R. Kornowski, Schaumburg; Chong S. Kim, Naperville; Chris L. Tsakiridis, Chicago; Daniel R. Schroeder, Carol Stream; Matthew A. Stahl, Des Plaines, all of Ill.

[73] Assignee: Lumex, Inc., Palatine, Ill.

[21] Appl. No.: 08/876,910

[22] Filed: Jun. 17, 1997

[51] Int. Cl.$^6$ .............................. F21V 23/00; H01R 33/72
[52] U.S. Cl. .......................... 362/368; 362/226; 362/800; 313/318.06; 313/498
[58] Field of Search ........................ 313/318.05, 318.06, 313/318.12, 498, 500, 512, 505; 362/226, 368, 800, 382; 439/56, 78, 83

[56] References Cited

U.S. PATENT DOCUMENTS

| | | | |
|---|---|---|---|
| Re. 34,254 | 5/1993 | Dragoon | 362/307 |
| 2,998,597 | 8/1961 | Edwards | 362/27 |
| 4,016,449 | 4/1977 | Gale et al. | 313/500 |
| 4,152,624 | 5/1979 | Knaebel | 313/512 |
| 4,510,555 | 4/1985 | Mori | 362/565 |
| 4,702,708 | 10/1987 | Reuss et al. | 439/83 |
| 4,811,171 | 3/1989 | Viola | 362/485 |
| 4,839,781 | 6/1989 | Barnes et al. | 362/299 |
| 4,874,224 | 10/1989 | Gutman et al. | 359/618 |
| 4,920,467 | 4/1990 | Honsberger | 362/226 |
| 4,935,856 | 6/1990 | Dragoon | 362/357 |
| 4,954,930 | 9/1990 | Maegawa et al. | 362/26 |
| 5,027,258 | 6/1991 | Schöniger et al. | 362/31 |
| 5,070,431 | 12/1991 | Kitazawa et al. | 362/31 |
| 5,130,897 | 7/1992 | Kuzma | 362/24 |
| 5,239,226 | 8/1993 | Seredich et al. | 313/318.05 |
| 5,327,328 | 7/1994 | Simms et al. | 362/26 |
| 5,349,504 | 9/1994 | Simms et al. | 362/555 |
| 5,386,487 | 1/1995 | Briggs et al. | 385/59 |
| 5,564,819 | 10/1996 | Yamaguchi | 362/800 |
| 5,660,461 | 8/1997 | Ignatius et al. | 362/800 |
| 5,709,554 | 1/1998 | Savage, Jr. | 439/56 |

OTHER PUBLICATIONS

PRISM™ CBI™, SMD Circuit Board Indicators, Dialight Catalog, May 1994, Dialight, 1913 Atlantic Ave., Manasquan, New Jersey 08736.

Application Brief, *Light Guide Techniques Using LED Lamps,* Hewlett–Packard Co., 1993.

Industrial Devices, Inc. Catalog, Series 7512D Bright*Pipes™ Optical Light Pipes, Description and Features.

Dialight, 3mm Square microLED© Optopipe™ Optical Light Pipe, Quad High.

*Primary Examiner*—Alan Cariaso
*Attorney, Agent, or Firm*—Pauley Petersen Kinne & Fejer

[57] ABSTRACT

An apparatus and method of manufacture for a light source housing apparatus. The housing is insert molded around a plurality of electrically separated leads and defines a cavity. A portion of each lead is exposed along a bottom surface of the housing. Two or more leads have terminal portions near a rear surface of the housing. A lead, which can be used to protect against electrostatic discharge, is also mounted along a front face of the housing and terminates at a ring portion which defines an opening that is aligned with the cavity. The opening of the ring portion is preferably sized and shaped to correspond to an outer peripheral surface of a lens, lightpipe or other optical media, so that the lens can be inserted through the ring portion and into the cavity. A light source, such as an LED, is mounted within a cutout of the housing. The housing is manufactured using lead sets each having pre-formed leads indexed by a leadframe through an injection mold to form the housing around each lead set. After the insert molding process at least a portion of the leadframe is removed to electrically isolate the leads. If used with surface mount technology, the housing is preferably self-aligning.

17 Claims, 5 Drawing Sheets

LIGHT SOURCE HOUSING APPARATUS AND METHOD OF MANUFACTURE

BACKGROUND OF THE INVENTION

1. Field of the Invention

This invention relates to a light source housing apparatus, such as for a light-emitting diode (LED), having a plurality of electrically separated leads extending from a bottom surface, the plurality of leads terminating in light source contacts and a static ring. This invention also relates to a method of manufacture of such a light source housing apparatus.

2. Description of Prior Art

Electronic equipment often employs some form of visual status indication, often provided by an optical medium, such as a lens or a lightpipe, linked to light source, such as an LED, mounted on a substrate, such as a printed circuit board. Frequently, circuit densities of equipment require that the light source be positioned at an angle to the printed circuit board.

Conventional approaches to providing a printed circuit board with a right-angle-viewable light source include lightpipes that bend beams emitted by a light source, such as an LED, and right angle prisms that similarly bend beams emitted by a light source. Disadvantages of such conventional approaches include non-uniform optical transmission from the light source to the output, such as brightness decay and optical bleed-through from adjacent lightpipes, as well as higher-cost and higher-defect assembly.

One conventional approach that solves the problem of non-uniform optical transmission uses a light source, such as an LED, having leads bent at right angles from the printed circuit board. This approach involves two solderable attachment areas between a light source housing apparatus and the printed circuit board. However, this approach may result in misalignment of the light source housing apparatus within the electronic device and potentially damaging electrostatic discharge through the lens and into circuitry mounted within equipment having nonconducting front panels. Another disadvantage of such conventional approach relates to high assembly costs and defect rates. Typically, in a conventional bent-lead type light source housing apparatus, the leads are inserted into voids within a prefabricated housing. The conventional insertion process often results in misted leads and light source housing assemblies missing one or both leads.

It is apparent from the teachings of the prior art that there is need for a light source housing apparatus that permits visual status indication at an angle, such as a right angle, from a printed circuit board without the use of optical media that bends or distorts the light source output, reducing transmission efficiency. It is also apparent from the teachings of the prior art that there is a need for a light source housing apparatus that protects the light source and connected circuitry from potentially damaging electrostatic discharge. It is also apparent there is a need, particularly with respect to surface mount technology, for a light source housing apparatus design that permits proper alignment of the light source with respect to the printed circuit board. It is further apparent that there is a need to produce a light source housing apparatus in a cost-effective manner and at a low-defect rate.

SUMMARY OF THE INVENTION

It is one object of this invention to provide a light source housing apparatus that permits properly aligned visual status indication at an angle, such as a right angle, from a printed circuit board, particularly without optical distortion of the light source.

It is another object of this invention to provide a light source housing apparatus which protects the light source, such as an LED, and connected circuitry from electrostatic discharge.

It is a further object of this invention to provide a method of manufacture of a light source housing apparatus that results in a low-defect rate, particularly at low production costs.

It is yet another object of this invention to provide a method of manufacturing a light source housing apparatus that does not require extra manufacturing steps such as bending and inserting leads into voids within a prefabricated housing.

It is still another object of this invention to provide a method of manufacturing a light source housing apparatus that results in a plurality of electrically-isolated leads within a molded light source housing.

In one preferred embodiment according to this invention, a light source housing has an overall generally rectangular external shape and a cavity extending from an opening in a front face of the housing towards a rear face of the housing, terminating in a cutout extending from the rear face of the housing. Preferably, a lens or a lightpipe is inserted through an opening in the front face and is mounted within the cavity.

In an apparatus for a housing having a single light source, according to one preferred embodiment of this invention, a housing is preferably insert molded around a first lead, a second lead and a third lead, such that a portion of each lead is exposed along at least a bottom surface of the housing. The first lead and the second lead are mounted within the housing such that each respective lead extends, electrically separated from each other, from the bottom surface of the housing to the cutout in the housing. A light source, such as an LED, is preferably mounted within the cutout so that contacts of the light source electrically connect with corresponding contacts formed at terminal portions of each of the first lead and the second lead.

The third lead is preferably but not necessarily mounted along or in an area near the front face of the housing and is electrically separated from the first and the second leads. The third lead is also exposed at, and extends beyond, the bottom surface of the housing. The third lead preferably terminates at a ring portion which defines an opening that is aligned with the cavity on the front face of the housing. The opening of the ring portion is preferably sized and shaped to accommodate insertion of a lens or lightpipe through the ring portion and into the cavity. The ring portion is preferably connected with an electrical ground and thus protects the light source and connected circuitry, as well as surrounding circuitry, from electrostatic discharge.

According to another preferred embodiment of this invention, the housing apparatus may accommodate two or more light sources, such as multiple LEDs. In this preferred embodiment of the invention, housing is preferably insert molded around a lead set having one or more first leads, one or more second leads and a third lead. As a result of this embodiment, light sources and respective leads are arranged in horizontal or vertical layers and/or are arranged in matrix fashion.

The light source housing apparatus of this invention is preferably produced according to a multiple step method of manufacture. Lead sets having pre-formed leads are indexed by a leadframe through an injection mold to form the housing around each lead set. Preferably the housing is insert molded around at least the first and the second leads, and preferably the third lead, wherein portions of each of the leads are encased within the housing.

The first lead and the second lead remain exposed, preferably along the periphery of the cutout, to form a first contact and a second contact. A light source is then mounted within the cutout. Additionally, a cathode pad, an anode pad and a ground pad are each exposed at, and extend from, the bottom surface of the housing. However, immediately after the insert molding process each of the leads remain connected with respect to each other through the leadframe. At least a portion of the leadframe is removed to electrically isolate the first lead, the second lead and the third lead. This method avoids bending and inserting leads into voids within a pre-formed housing because the housing is formed around the leads, according to this invention, during the insert molding process.

BRIEF DESCRIPTION OF THE DRAWINGS

The above-mentioned and other features and objects of this invention will be better understood from the following detailed description taken in conjunction with the drawings wherein.

DESCRIPTION OF PREFERRED EMBODIMENTS

This invention relates to an apparatus that houses a light source, such as an LED, generally used for visual status indication, and to a method for manufacturing the apparatus. A related apparatus and the general state of the art is described in *A Novel Right-Angle LED Design*, incorporated into this specification by reference, by Kornowski and Schroeder and published in the September, 1996 issue of SMT. Although the terms light emitting diode or LED and light source are used throughout this specification and in the claims, it is apparent such terms are interchangeable and that the apparatus according to this invention is appropriate for use with any similar light source, such as incandescent and gas tube opto/components, miniature filament lamps or any other suitable light emitting device known to those having ordinary skill in the art. As used throughout this specification and in the claims, the term LED is intended to relate to a bare die in its most basic form. It is apparent that the LED can be a surface-mounted LED, a wire-bond LED or any other suitable LED structure known to those skilled in the art.

The light source housing apparatus, for mounting an LED according to one preferred embodiment of this invention, preferably comprises housing 10 which forms or defines cavity 15. Preferably, housing 10 is injection molded or according to one preferred method described below, is insert molded. Housing 10 is preferably, but not necessarily, molded from a rigid polymeric material such as a Polyphenylene Sulfide (PPS), for example RYTON™. In surface mount applications, the color of housing 10 can be selected to optimize the device characteristics with respect to the soldering process.

Figure 1:
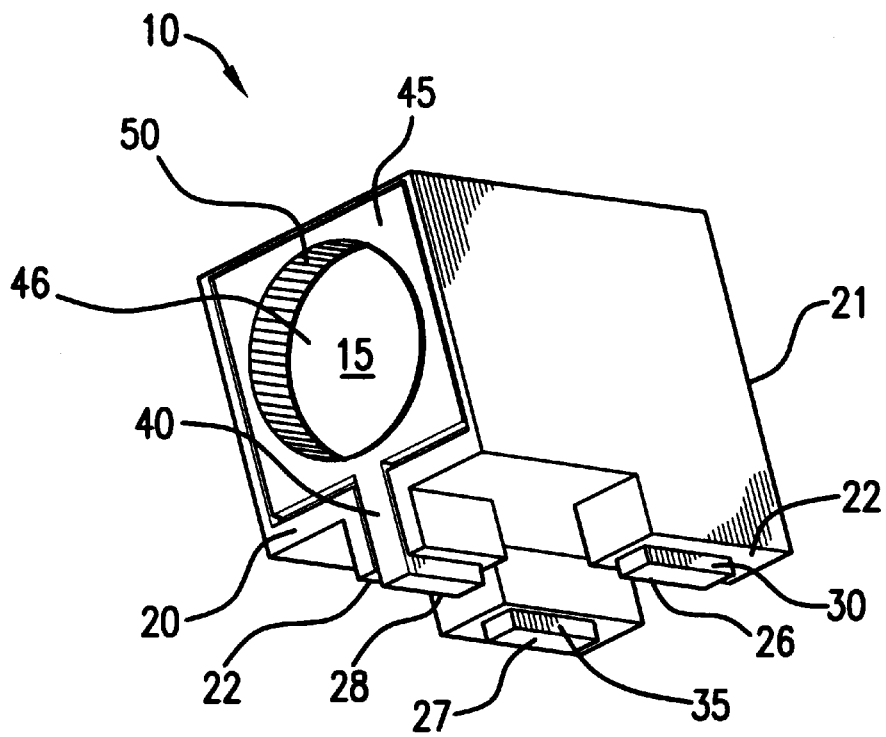
FIG. 1 is a front perspective view of a light source housing apparatus, according to one preferred embodiment of this invention.

As shown in FIG. 1, external surfaces of housing 10 are preferably, but not necessarily, generally rectangular. Housing 10 defines any suitably shaped cavity 15. Cavity 15 preferably extends from front face 20 of housing 10 toward rear face 21 of housing 10. Cavity 15 is exposed to a void formed by cutout 16, which extends into housing 10 from rear face 21 toward cavity 15. Cavity 15 is sized and shaped to accommodate a lens, or other optical media, such as a lightpipe or epoxy filling. The lens is inserted into cavity 15 preferably, although not necessarily, through an opening within front face 20.

Using a method as described below, according to one preferred embodiment of this invention, housing 10 is insert molded about at least three leads. Housing 10 is preferably insert molded about first lead 30, second lead 35 and third lead 40, such that a portion of each lead extends beyond or is otherwise exposed along at least bottom surface 22 of housing 10. Each of first lead 30, second lead 35 and third lead 40 are preferably constructed from nickel-plated or tin-plated copper or steel, or from another suitable electrical conducting material.

Figure 2:
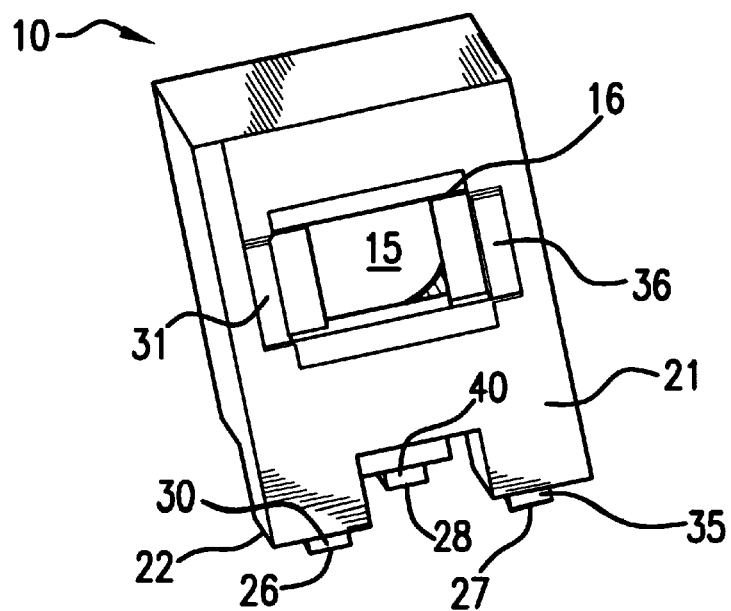
FIG. 2 is a rear perspective view of a light source housing apparatus, as shown in FIG. 1.

As shown in FIG. 2, first lead 30 and second lead 35 are mounted within openings formed by housing 10 such that each of first lead 30 and second lead 35 extend separately, electrically isolated from each other, from bottom surface 22 of housing 10 to a position exposed to cutout 16. First lead 30 is exposed at, and preferably extends beyond, bottom surface 22 of housing 10 to form cathode pad 26, as shown in FIG. 2. Also shown in FIG. 2, second lead 35 is exposed at, and preferably extends beyond, bottom surface 22 of housing 10 to form anode pad 27. Housing 10 electrically insulates first lead 30 from second lead 35. First lead 30 terminates to form first contact 31 near rear face 21 and is exposed to cutout 16. Second lead 35 terminates to form second contact 36 near rear face 21 and is also exposed to cutout 16. As used throughout this specification and drawings, the location of first lead 30 and second lead 35 and corresponding cathode pad 26 and anode pad 27 can be interchanged with respect to housing 10, without departing from the spirit of the invention.

The light source, or LED in one preferred embodiment, is preferably mounted within cavity 15 of housing 10. In one preferred embodiment of this invention, the LED is positioned so that first contact 31 and second contact 36 form an electrical connection with respective electrical contacts of the LED. The light source, particularly when a surface-mounted LED, is preferably but not necessarily mounted with a frictional fit between first contact 31 and second contact 36. In another preferred embodiment of this invention, the light source is soldered or otherwise adhered to first contact 31 and second contact 36, such as with a suitable conductive adhesive or material.

As shown in FIG. 1, third lead 40 is preferably mounted with respect to housing 10, preferably along front face 20 of housing 10. It is apparent that in another preferred embodiment of this invention, third lead 40 is unnecessary, for example, if there is no requirement to protect light source and connected circuitry from electrostatic discharge. Third lead 40 is electrically separated from each of first lead 30 and second lead 35. Preferably, third lead 40 is exposed at, and extends beyond, bottom surface 22 of housing 10 to form ground pad 28. According to one preferred embodiment of this invention, as shown in FIG. 1, third lead 40 is positioned within and routed through an injection molded channel within housing 10, from ground pad 28 to ring portion 45. As shown in FIG. 1, third lead 40 preferably merges into or terminates at ring portion 45 which is positioned adjacent front face 20 of housing 10. Ring portion 45 defines opening 46 that is preferably aligned with cavity 15, so that a lens or lightpipe can be inserted through opening 46 and into cavity 15. Ring portion 45 is preferably positioned with respect to housing 10 so that any electrostatic discharge is conducted through third lead 40 in lieu of through a lens or lightpipe, through the LED and into circuitry connected to and/or surrounding the LED. In one preferred embodiment of this invention, the size and shape of the outer perimeter of ring portion 45 approximately corresponds with the size and shape of a periphery of front face 20 of housing 10 and/or the size and shape of opening 46 approximately corresponds with the size and shape of a periphery of a lens or lightpipe.

Figure 7:
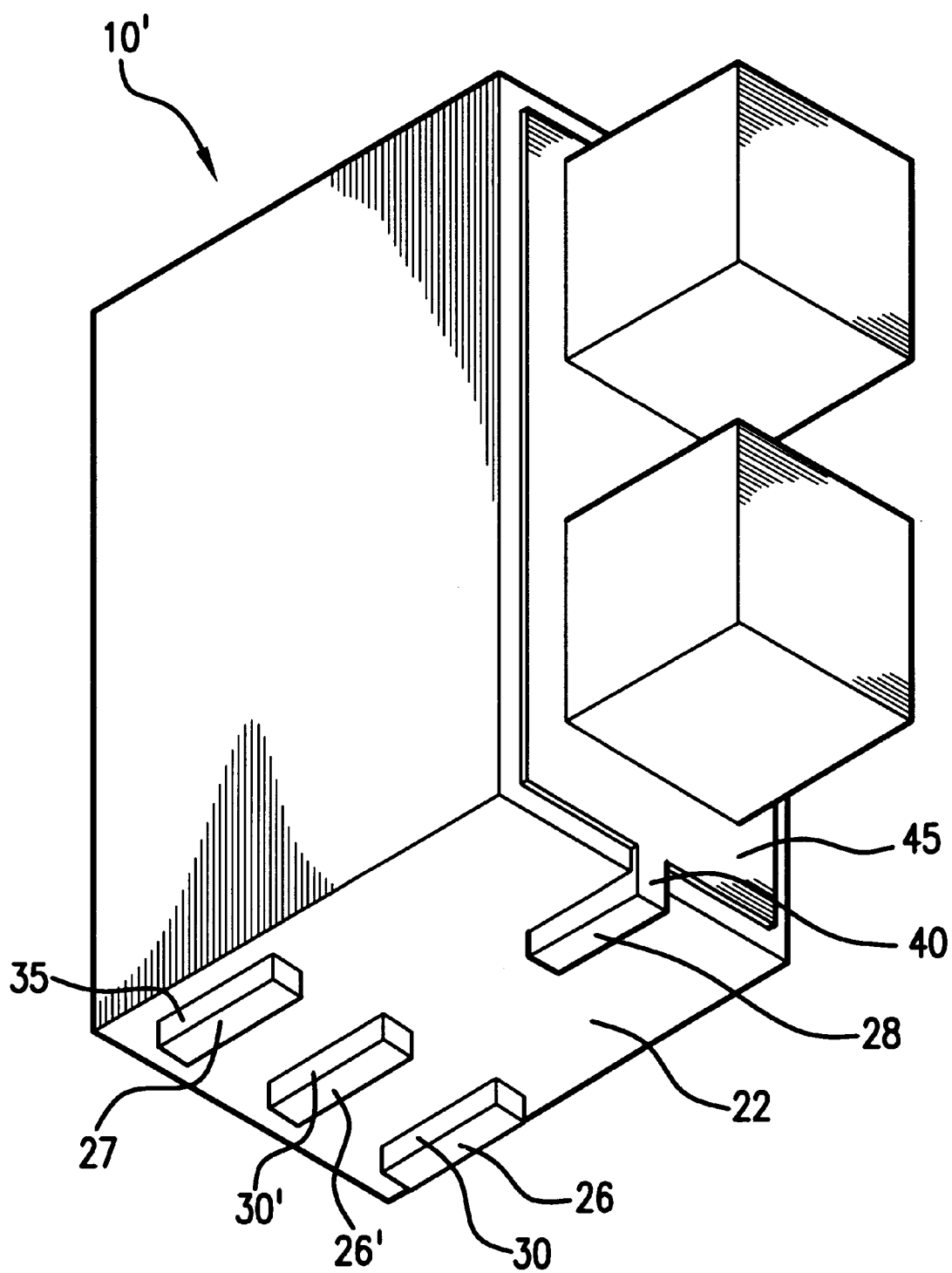
FIG. 7 is a diagrammatic bottom view of a light source housing apparatus, according to yet another preferred embodiment of this invention.

As shown in FIG. 1, opening 46 is circular and has an inner diameter preferably sized to allow insertion of a lens, lightpipe or other suitable optical media into cavity 15. As shown in FIG. 7, opening 46 may be non-circular, such as rectangular, to accommodate corresponding lenses or lightpipes having non-circular cross-sections. In one preferred embodiment of this invention, ring portion 45 has a plurality of projections 50, such as teeth, barbs, hooks or the like, each having a portion extending radially inward toward opening 46. Projections 50 may be directed inward toward cavity 15 and are used to retain a lens, lightpipe or other optical media within cavity 15; in such preferred embodiment, a portion of the lens is positioned within opening 46. Projections 50 are preferably but not necessarily spaced equidistantly around the periphery of opening 46, as shown in FIG. 1. Lenses or lightpipes could also be designed to snap fit into housing 10 using common retaining methods known to those skilled in the art.

Figure 4:
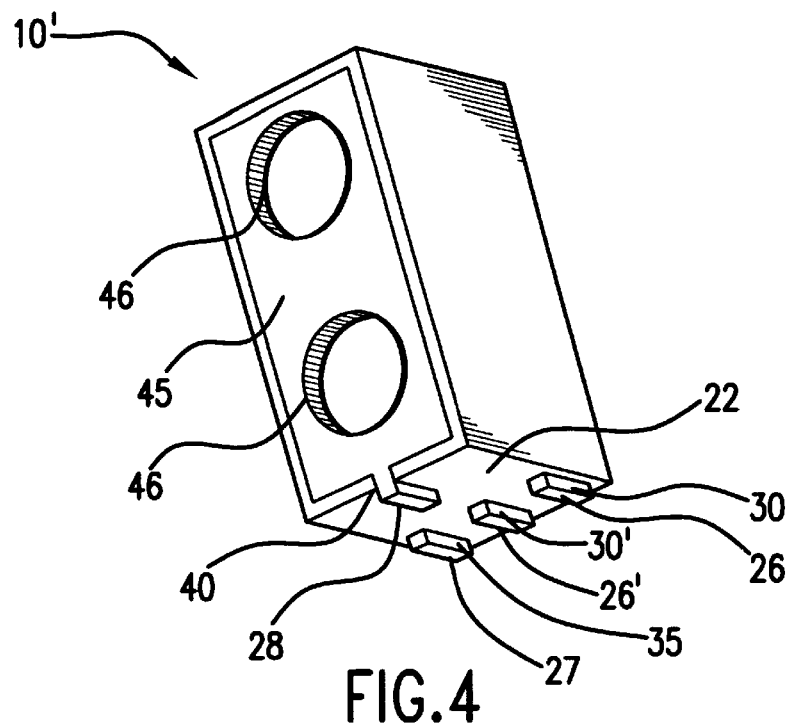
FIG. 4 is a front perspective view of a multiple light sources housing apparatus, according to another preferred embodiment of this invention.
Figure 5:
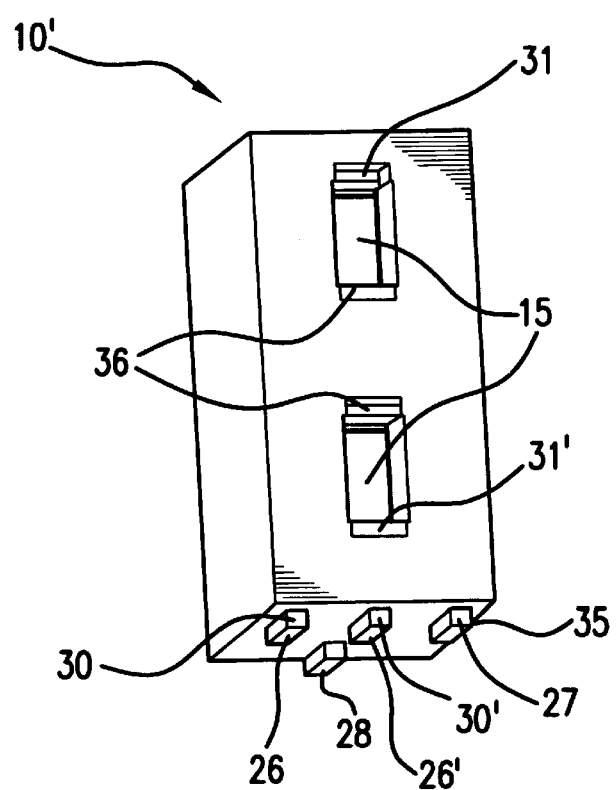
FIG. 5 is a side perspective view of a multiple light sources housing apparatus, as shown in FIG. 4.

In another preferred embodiment of this invention, shown in FIGS. 4 and 5, housing 10' may accommodate multiple light sources. FIG. 4 shows housing 10' having a plurality of openings 46, each of which may retain a lens or lightpipe. In this preferred embodiment, housing 10' is preferably insert molded about at least one additional first lead 30' and one additional cathode pad 26' is exposed beyond bottom surface 22, also as shown in FIGS. 4 and 5. Alternatively, and not shown in the drawings, housing 10' may contain one additional second lead 35' and one additional anode pad 27'. For each additional first lead 30' or second lead 35', ring portion 45 of third lead 40 preferably contains at least one extra opening 46, when compared to the embodiment shown in FIG. 1. For each additional light source, housing 10' preferably contains one additional first lead 30' and/or one additional second lead 35' for independent power control to each light source. To maintain independent control, each light source can have: dedicated first leads 30, 30' and a common second lead 35; a common first lead 30 and dedicated second leads 35, 35'; or dedicated first leads 30, 30' and dedicated second leads 35, 35'. If common control of any two or more light sources is desired, then such light sources can correspond to a common first lead 30 and a common second lead 35.

As used in this specification, the term LED lens is intended to relate to a lens molded around or encasing an LED. In one preferred embodiment of this invention, when inserted within cavity 15, the LED lens is preferably spaced from ring portion 45, with enough clearance to prevent electrical conductance from ring portion 45 to the LED lens. In such preferred embodiment of this invention, with the LED lens positioned within cavity 15, no portion of the LED lens is positioned within opening 46.

Referring back to FIGS. 1–3, first lead 30 comprises cathode pad 26, second lead 35 comprises anode pad 27, and third lead 40 comprises ground pad 28 which form three contact areas between housing 10 and a printed circuit board, when housing 10 is mounted with respect to a printed circuit board. Three contact areas may be important, specifically in surface mount technology, because during the soldering process, or otherwise mounted with respect to the printed circuit board, housing 10 will self-align with a front panel hole or another area that requires alignment of housing 10. Self-alignment results from the triangulation forces created by the surface tension of molten solder during attachment of housing 10 to a substrate, such as a printed circuit board. Cathode pad 26 and anode pad 27 are soldered or otherwise attached to respective electrical contacts on the printed circuit board. Ground pad 28 is soldered or otherwise attached to an electrical ground of the printed circuit board.

According to FIGS. 1 and 2, housing 10 is produced according to a multiple step method of manufacture. Manufacture of housing 10 with the method according to this invention reduces several difficult and costly steps required in conventional LED housing manufacture methods. The preferred method of this invention eliminates the need to insert leads within voids of a preconstructed housing, which is time-consuming and lessens quality control. The method according to this invention increases quality control by reducing defects, for example those caused by incorrectly inserted leads, stress-induced failures due to lead bending, or by leads that are not securely fitted with respect to the housing.

Figure 3:
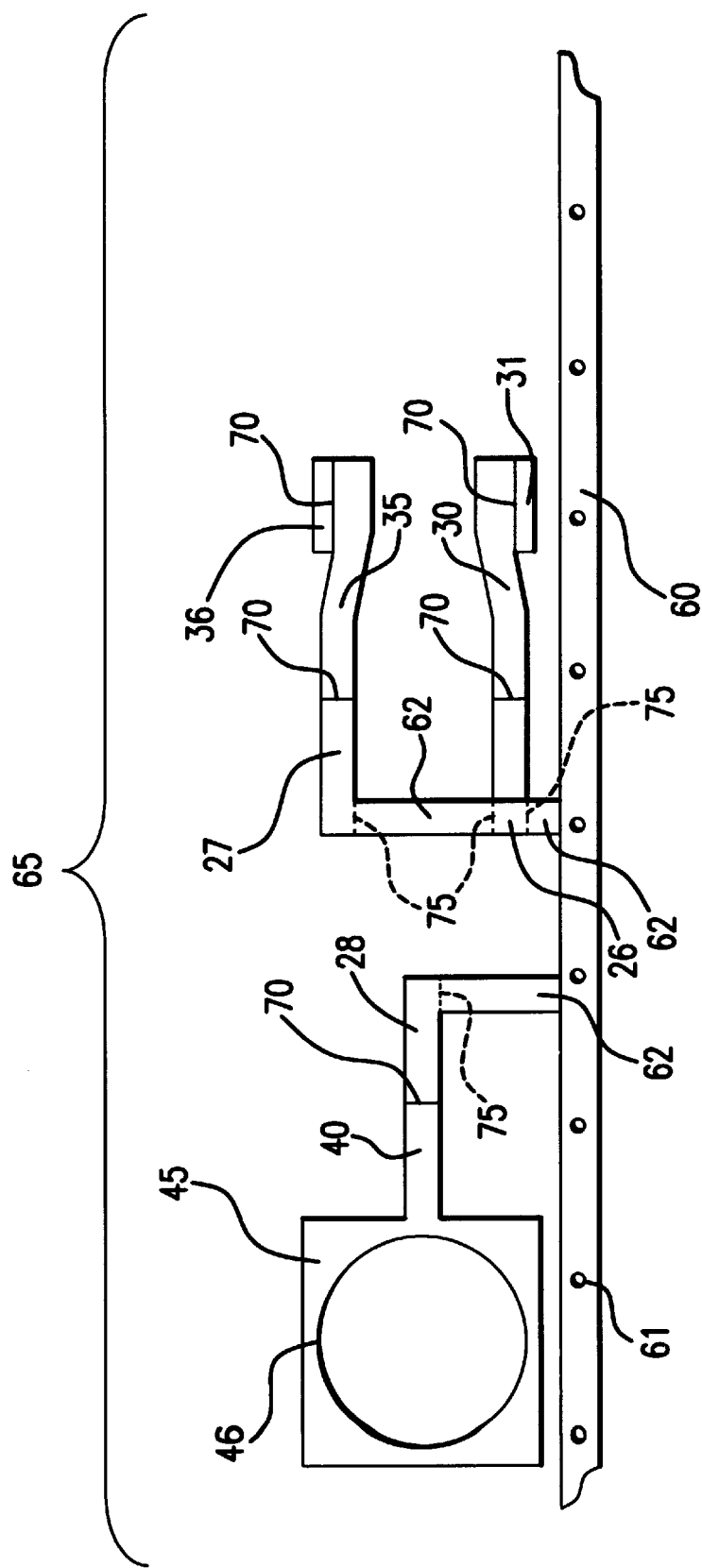
FIG. 3 is a diagrammatic top view of a leadframe having multiple lead sets, according to one preferred embodiment of this invention.

FIG. 3 shows leadframe 60 preferably constructed from the same material as first lead 30, second lead 35 and third lead 40, such as nickel-plated or tin-plated steel or copper, or any other suitable electrical conductor material. According to one preferred embodiment of this invention, leadframe 60 contains a plurality of apertures 61 which may be used for indexing leadframe 60 during the step where housing 10 is injection molded. Housing 10' shown in FIGS. 4 and 5 is insert molded in a similar manner as housing 10 shown in FIGS. 1 and 2.

A plurality of lead sets 65 are preferably integrally formed with respect to leadframe 60. According to one preferred embodiment of this invention, each lead set 65 comprises first lead 30, second lead 35 and third lead 40, all connected or attached with respect to leadframe 60. As shown in FIG. 3, first lead 30 is spaced with respect to second lead 35 and third lead 40 is spaced with respect to first lead 30 and second lead 35. In one preferred embodiment of this invention, each lead set 65 is pre-formed by bending respective leads about folding lines 70. Such bending results in lead sets 65 that are in a similar physical arrangement before and after the molding process.

Lead set 65 comprises a single group of preformed leads including first lead 30, second lead 35 and third lead 40, as shown in FIG. 3. Lead sets 65 are indexed by leadframe 60 with respect to an injection mold. Indexing permits the injection mold to form a single housing 10 around each preformed and bent lead set 65. Housing 10 is preferably formed about each lead set 65 through an insert molding process, wherein portions of each of first lead 30, second lead 35 and third lead 40 are encased within housing 10. The insert molding process results in housing 10 fixing first lead 30, second lead 35 and third lead 40 in a consistent location within housing 10, because the insert molding process significantly reduces, as compared to conventional methods of manufacture, the clearance between housing 10 and first lead 30, second lead 35 and/or third lead 40.

Figure 6:
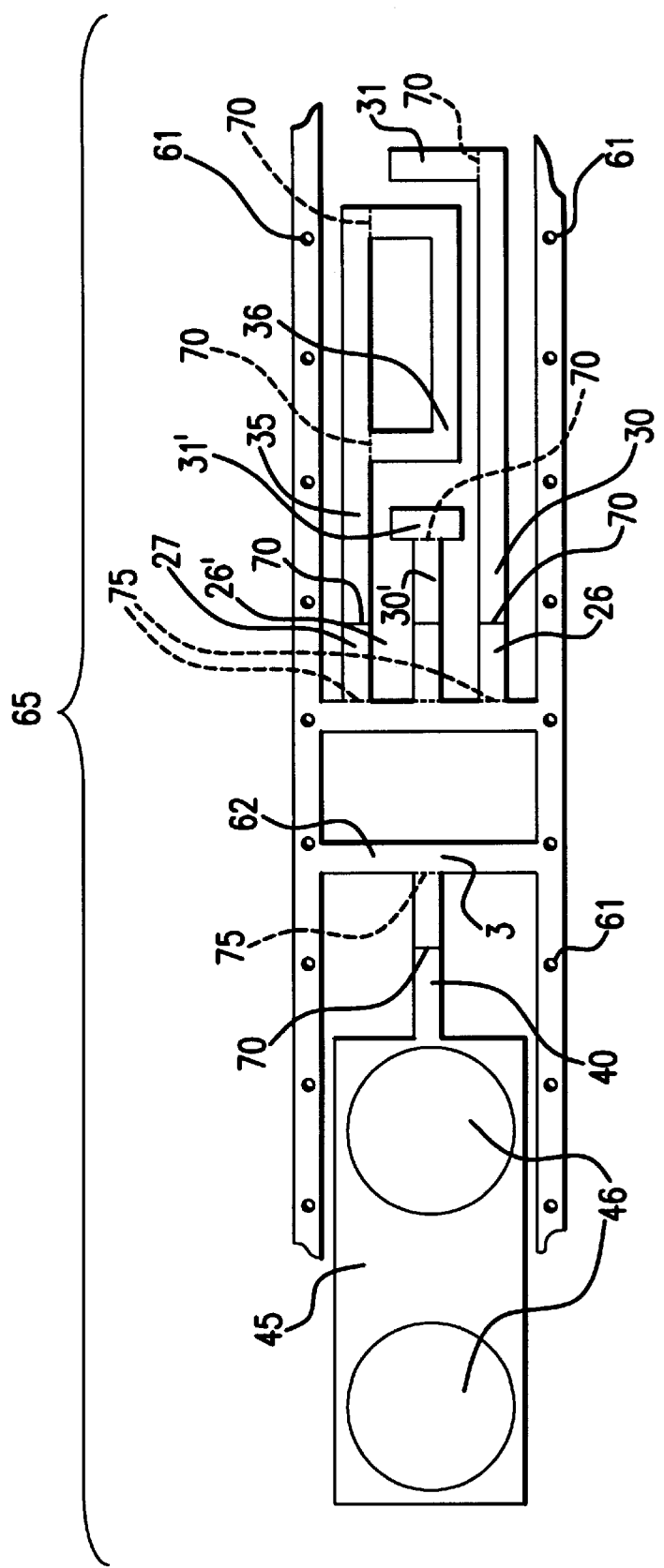
FIG. 6 is a diagrammatic top view of a leadframe having a lead set according to another preferred embodiment of this invention.

In another preferred embodiment of this invention, FIG. 6 shows lead set 65 which generally corresponds to the embodiment of this invention as shown in FIGS. 4 and 5. Lead set 65 comprises two first leads 30, 30' and one second lead 35.

Referring back to the preferred embodiment of this invention as shown in FIGS. 1–3, after the insert molding step is complete, first lead 30 remains exposed within cutout 16, such as at first contact 31. Likewise, second lead 35 remains exposed within cutout 16, such as at second contact 36. The LED is mounted within cutout 16 so that respective contacts of the LED electrically communicate with first contact 31 and second contact 36.

As a result of the insert molding process, first lead 30, second lead 35 and third lead 40 are formed within housing 10 and preferably may not be removed without destroying housing 10, first lead 30, second lead 35 and/or third lead 40. Additionally, any one of first lead 30, second lead 35 and third lead 40 may contain apertures, not shown in FIG. 3, which are filled with polymeric material, such as thermoplastic material or thermoset material, during the insert molding process, thus resulting in a consistently tighter fit of the leads with respect to housing 10.

After the insert molding process is complete, each of cathode pad 26, anode pad 27 and ground pad 28 remain connected with respect to each other by leadframe 60. Removable sections 62 of leadframe 60 are then removed and thus electrically isolate cathode pad 26, anode pad 27 and ground pad 28 and thereby also electrically isolate first lead 30, second lead 35 and third lead 40. FIG. 3 shows separation lines 75 along which leadframe 60 may be cut or otherwise separated to electrically isolate first lead 30, second lead 35 and third lead 40.

While in the foregoing specification this invention has been described in relation to certain preferred embodiments thereof, and many details have been set forth for purpose of illustration, it will be apparent to those skilled in the art that the invention is susceptible to additional embodiments and that certain of the details described can be varied considerably without departing from the basic principles of this invention.

We claim:

1. A method for manufacturing an apparatus for mounting a light source, known as a light emitting diode, the method comprising the steps of:

(a) forming a leadframe and at least one lead set attached with respect to the leadframe, each said lead set having a first lead and a second lead attached with respect to said leadframe wherein said first lead is spaced with respect to said second lead, and each said lead set having a third lead attached with respect to said leadframe;

(b) injection molding a polymeric material about each said lead set and forming a cavity and a cutout wherein at least a portion of said first lead is exposed to said cutout and at least a portion of said second lead is exposed to said cutout;

(c) removing at least a portion of said leadframe to electrically isolate said first lead, said second lead and said third lead; and (d) the light emitting diode mounted within said cutout so that a first contact of the light emitting diode electrically communicates with said first lead and so that a second contact of the light emitting diode electrically communicates with said second lead.

2. A method according to claim 1 wherein said polymeric material is injection molded to form a bottom surface of a housing wherein said first lead, said second lead and said third lead extend beyond said bottom surface.

3. A method according to claim 1 wherein said first lead and said second lead each is bent at least at one location before the polymeric material is injection molded.

4. A method according to claim 1 wherein said third lead is bent at least at one location before the polymeric material is injection molded.

5. A method according to claim 4 wherein said third lead has a ring portion with an opening and said third lead is bent so that said opening is aligned with said cavity.

6. A method according to claim 1 wherein said lead set further comprises at least one additional first lead connected with respect to said lead set.

7. A method according to claim 1 wherein said lead set further comprises at least one additional second lead connected with respect to said lead set.

8. An apparatus for mounting a light emitting diode, the apparatus comprising:
   a housing having a cavity, a first lead mounted with respect to said housing, a second lead mounted with respect to said housing, said first lead electrically separated from said second lead;
   a third lead mounted with respect to said housing, said third lead electrically separated from each of said first lead and said second lead; and
   the third lead having a ring portion, said ring portion having an opening aligned with said cavity and a plurality of projections each with a portion extending toward said cavity.

9. An apparatus according to claim 8 further comprising a light emitting diode mounted with respect to said housing, said light emitting diode having a first contact and a second contact, said first contact in electrical communication with said first lead, and said second contact in electrical communication with said second lead.

10. An apparatus according to claim 8 wherein said light emitting diode is a surface-mounted light emitting diode.

11. An apparatus according to claim 8 wherein said light emitting diode is a wire-bond light emitting diode.

12. An apparatus according to claim 8 wherein said housing has a cutout, at least a portion of said first lead is exposed to said cutout, and at least a portion of said second lead is exposed to said cutout.

13. An apparatus according to claim 12 wherein a light emitting diode is frictionally mounted between said at least a portion of said first lead and said at least a portion of said second lead.

14. An apparatus according to claim 12 wherein a light emitting diode is mounted within said cutout.

15. An apparatus according to claim 8 wherein said housing has a bottom surface, at least a portion of said first lead extends beyond said bottom surface, and at least a portion of said second lead extends beyond said bottom surface.

16. An apparatus according to claim 8 wherein said housing has a bottom surface and said third lead extends beyond said bottom surface.

17. An apparatus according to claim 8 wherein said housing is injection molded about said first lead and said second lead.

\* \* \* \* \*